United States Patent [19]

Lin

[11] Patent Number: 4,585,997

[45] Date of Patent: Apr. 29, 1986

[54] METHOD AND APPARATUS FOR BLANKING NOISE PRESENT IN AN ALTERNATING ELECTRICAL SIGNAL

[75] Inventor: Frank W. Lin, Los Altos, Calif.

[73] Assignee: TeleVideo Systems, Inc., San Jose, Calif.

[21] Appl. No.: 559,526

[22] Filed: Dec. 8, 1983

[51] Int. Cl.$^4$ .................................... H03M 13/00
[52] U.S. Cl. ............................ 328/165; 307/542;
            307/445; 377/75; 318/602
[58] Field of Search .................. 307/542, 445, 244;
        377/64, 73, 75, 81; 328/162, 163, 164, 165;
                                                318/602

[56] References Cited

U.S. PATENT DOCUMENTS

| | | | |
|---|---|---|---|
| 3,310,751 | 3/1967 | Atzenbeck | 328/162 |
| 3,493,874 | 2/1970 | Finkel et al. | 328/165 |
| 3,667,054 | 5/1972 | Nelson | 377/75 |
| 3,814,917 | 6/1974 | Nussbaumer | 328/162 |
| 4,449,061 | 5/1984 | Yasuda et al. | 328/164 |

Primary Examiner—John S. Heyman
Assistant Examiner—Karl Ohralic
Attorney, Agent, or Firm—Townsend and Townsend

[57] ABSTRACT

A noise blanking circuit for eliminating evidence of noise present in an incoming alternating electrical control signal, such as a shaft encoder or tachometer signal in a servo control circuit, is disclosed. The alternating electrical signal is input to a first input of a shift register having a plurality of outputs. Clock signals having a preselected frequency are input to a second input of the shift register for digitally sampling the alternating electrical signal at the times of occurrence of the clock signals so as to produce digital samples shiftably stored in respective storage locations of the shift register, which are connected to the plurality of outputs of the shift register. The digital samples appearing at predetermined ones of the plurality of outputs of the shift register are input to a logic circuit for producing a first logic state (low state) as an output signal, when a first logic state appears at the predetermined ones of the plurality of outputs of the shift register, and a second logic state (high state) as the output signal, when a second logic state appears at the predetermined ones of the plurality of outputs of the shift register. The selectivity of the noise blanking circuit can be selected by adjusting the clock signal frequency and/or the number of storage locations included in the shift register and/or changing the predetermined ones of the plurality of outputs of the shift register which are input to the logic circuit. Other features are also disclosed.

20 Claims, 3 Drawing Figures

FIG._3.

METHOD AND APPARATUS FOR BLANKING NOISE PRESENT IN AN ALTERNATING ELECTRICAL SIGNAL

BACKGROUND OF THE INVENTION

This invention relates to electrical noise detection circuits and, more particularly, to circuits responsive to an incoming alternating electrical signal permeated by noise for producing an outgoing electrical signal in which the noise is suppressed. Specifically, the invention is directed to a method and apparatus for blanking noise present in an incoming alternating electrical control signal for producing an outgoing electrical control signal in which no evidence of the noise appears, especially in inherently noisy environments, such as encountered in the use of servomotors in conjunction with the operation of printers, disc drives, and other equipment used in information processing.

In order to facilitate an understanding of the invention, the invention will be described by way of example in connection with printers, namely, daisy wheel printers. The exemplary use of the invention in connection with a daisy wheel printer, however, is by way of illustration only and is not to be interpreted as a limitation of the principles of the invention to daisy wheel printers or to printers generally. As will become clear, the principles which underlie the invention apply generally to control circuits responsive to an incoming alternating electrical control signal in which noise is present for recognizing noise and producing an outgoing electrical control signal which is free from noise.

In a daisy wheel printer, a petal shaped print wheel is rotatably mounted to a carriage. The carriage is reciprocally mounted with respect to a paper feeder so that the reciprocal movement of the carriage is orthogonal with respect to the direction of paper feed, for example, the paper is fed vertically and the carriage is moved horizontally. Rotation of the print wheel, reciprocation of the carriage, and movement of the paper by means of the paper feeder, preconditions the daisy wheel printer for enabling a character to be printed at a preselected print position. Printing requires that the paper be indexed to a line position, the carriage be moved to a character position, and the print wheel be rotated to a selected character, whereupon a hammer means is energized for striking the wheel causing the wheel to be impacted on a ribbon interposed between the wheel and the paper, thereby imprinting a character on the paper.

The print wheel and the carriage are moved to the appropriate positions by respective servomechanisms. In the case of the print wheel, the servomechanism is under the control of a host which selects the characters to be printed. The order in which the characters are printed is also determined by the host which selects the character positions.

It is desirable that the carriage is moved to the proper character position and the print wheel is rotated to the proper character before the hammer means is energized for printing the character on the paper. A long extant problem to which the present invention is addressed is that if the print wheel and/or carriage are not properly positioned by the time that the hammer means is energized, the quality of the printing suffers. That is, if there is a disparity between the position of the print wheel and/or carriage specified by the host and the actual position of the print wheel and/or carriage, imprecise positioning results which causes poor registration of the character with respect to a line on the paper, only a portion of the character being printed, and other unacceptable deviant print characteristics. Furthermore, and perhaps an even more onerous problem is that imprecise positioning of the print wheel and/or carriage can result in damage to or breakage of the print wheel. If the print wheel is rotated to an imprecise position evidenced by the petal shaped cantilevered character imprinting element being offset, that is, slightly out of registration with, the hammer means, impact of the hammer means against the character imprinting element can damage or break the element, thereby necessitating replacement of the print wheel.

In view of the criticality which attaches to properly positioning the print wheel and carriage in order to assure print quality and avoid printer downtime, the respective servomechanisms which position the print wheel and carriage include respective servomotors and closed loop servo control circuits responsive to a command signal from the host for controllably moving the print wheel and carriage to one of various positions with negative feedback for maintaining the position until another command signal is provided. Position feedback is generally provided by respective shaft encoder signals or can be derived from respective tachometer signals, and under optimum conditions the shaft encoders or tachometers must produce signals having sufficient signal-to-noise so that proper positioning can be achieved. However, spurious noise generated by noise sources, such as alternating current power lines, fluorescent light fixtures, other information processing equipment, etc., in the vicinity of the daisy wheel printer, decreases the signal-to-noise ratio of the shaft encoder or tachometer signals. The noise problem is exacerbated by the fact that the brushes of the servomotors themselves generate electrical noise and the daisy wheel printer has other noise sources, such as static electrical charges from the paper feeder. Consequently, noise is present which can adversely affect the signal-to-noise ratio of the signals produced by the shaft encoders or tachometers. As a result, the precision with which the print wheel and carriage are positioned can be substantially impaired.

In the past, the incoming alternating electrical control signals from the shaft encoders or tachometers have been filtered by analog noise filters in the form of resistor-capacitor filters. These resistor-capacitor filters, however, have various disadvantages. The time delays associated with resistor-capacitor filters adversely affect the response of the servo control circuits. Furthermore, the bandwidth of such resistor-capacitor filters is limited. Typically, only very high frequency noise is filtered. If high-frequency noise is filtered, however, the high-frequency content of the signals produced by the shaft encoders or tachometers is also eliminated. This results in rounding the leading and trailing edges in the case where the signals from the shaft encoders or tachometers are rectangular pulses. Unfortunately, sharp leading and trailing edges are needed in order to assure proper operation of digital circuitry. Furthermore, adjustability of the resistor-capacitor filters requires potentiometers or variable capacitors which are expensive.

A more advanced noise recognition and suppression technique is disclosed in a copending patent application of Tri S. Van, U.S. Ser. No. 536,916 filed on Sept. 27, 1983, entitled METHOD AND APPARATUS FOR MASKING NOISE PRESENT IN AN ALTERNATING ELECTRICAL SIGNAL assigned to the same assignee as this application. The embodiments disclosed in the referenced copending application include a hard-wired digital circuit, as well as a microprocessor circuit implementation. Although these embodiments produce acceptable results, the hard-wired digital circuit includes several one shots, which can be unstable, and a number of resistor-capacitor delay circuits. Hence, the hard-wired digital circuit is complex and can be difficult to implement. Furthermore, the microprocessor circuit implementation must handle a significant burden, such that the capability of a single microprocessor can be insufficient, and, therefore, multiple microprocessors can be needed in order to execute all functions required of the control circuit, which adds to the complexity and increases the expense of the microprocessor circuit implementation.

The invention provides cancellation of the effects of noise present in an incoming alternating electrical control signal without the limitations of a resistor-capacitor filter. Furthermore, the invention provides a noise blanking circuit which avoids the use of unstable one shots, as well as resistor-capacitor delay circuits, present in the hard-wired digital circuit disclosed in the referenced copending application and includes fewer circuit elements so as to result in a less complex circuit which can be easily implemented. Like the hard-wired digital circuit disclosed in the referenced copending application, however, the invention provides a circuit which does not place a significant demand on a microprocessor circuit and, therefore, avoids the complexity and expense of a multiple microprocessor implementation. The method and apparatus in accordance with the invention can effectively reduce the impact of noise present in the incoming alternating electrical control signals from the shaft encoders or tachometers included in the servo control circuits for the print wheel and carriage of a daisy wheel printer in order to increase the precision with which the print wheel and carriage are positioned, thereby assuring print quality and avoiding damage to or breakage of the wheel.

SUMMARY OF THE INVENTION

The invention provides a method and apparatus for blanking noise which appears in an incoming alternating electrical control signal, such as the signal from a shaft encoder or tachometer included in a servo control circuit of a positioning servomechanism, for example, the servomechanisms included in a daisy wheel printer for positioning a print wheel and carriage. The method and apparatus in accordance with the invention for blanking noise present in an alternating electrical control signal are characterized in that the evidence of noise present in the incoming alternating electrical control signal is eliminated without reducing the frequency content of the signal, thereby preserving the waveshape of the signal that would appear if noise were not present. Consequently, the method and apparatus in accordance with the invention are particularly useful where the incoming alternating electrical control signal is a squarewave pulse train for controlling the operation of digital circuitry.

In accordance with the method aspect of the invention, a method for blanking noise present in an alternating electrical signal is provided. The method preferably comprises the steps of: inputting the alternating electrical signal to a first input of a shift register means having a plurality of outputs; inputting clock signals having a preselected frequency to a second input of the shift register means for digitally sampling the alternating electrical signal at the times of occurrence of the clock signals so as to produce digital samples shiftably stored in respective storage locations of the shift register means connected to the plurality of outputs of the shift register means; and inputting the digital samples appearing at predetermined ones of the plurality of outputs of the shift register means to a logic circuit means for producing a first logic state as an output signal, when a first logic state appears at the predetermined ones of the plurality of outputs of the shift register means, and a second logic state as the output signal, when a second logic state appears at the predetermined ones of the plurality of outputs of the shift register means.

In accordance with the apparatus aspect of the invention, an embodiment is provided for blanking noise present in an alternating electrical signal. The apparatus preferably comprises: a shift register means having a first input, a second input, a plurality of outputs, and respective storage locations connected to the plurality of outputs; means for coupling the alternating electrical signal to the first input of the shift register means; means for coupling clock signals having a preselected frequency to the second input of the shift register means so as to digitally sample the alternating electrical signal at the times of occurrence of the clock signals in order to produce digital samples shiftably stored in the respective storage locations of the shift register means; and logic circuit means coupled to predetermined ones of the plurality of outputs of the shift register means for producing a first logic state as an output signal, when a first logic state appears at the predetermined ones of the plurality of outputs of the shift register means, and a second logic state as the output signal, when a second logic state appears at the predetermined ones of the plurality of outputs of the shift register means.

The method and apparatus in accordance with the invention effectively eliminate the evidence of noise present in an incoming alternating electrical control signal. Consequently, the outgoing electrical control signal appears free from noise.

BRIEF DESCRIPTION OF THE DRAWINGS

The above and other features of the invention and the concomitant advantages will be better understood and appreciated by those skilled in the art in view of the description of the preferred embodiments given below in conjunction with the accompanying drawings. In the drawings.

DESCRIPTION OF THE PREFERRED EMBODIMENTS

Figures 1, 2:
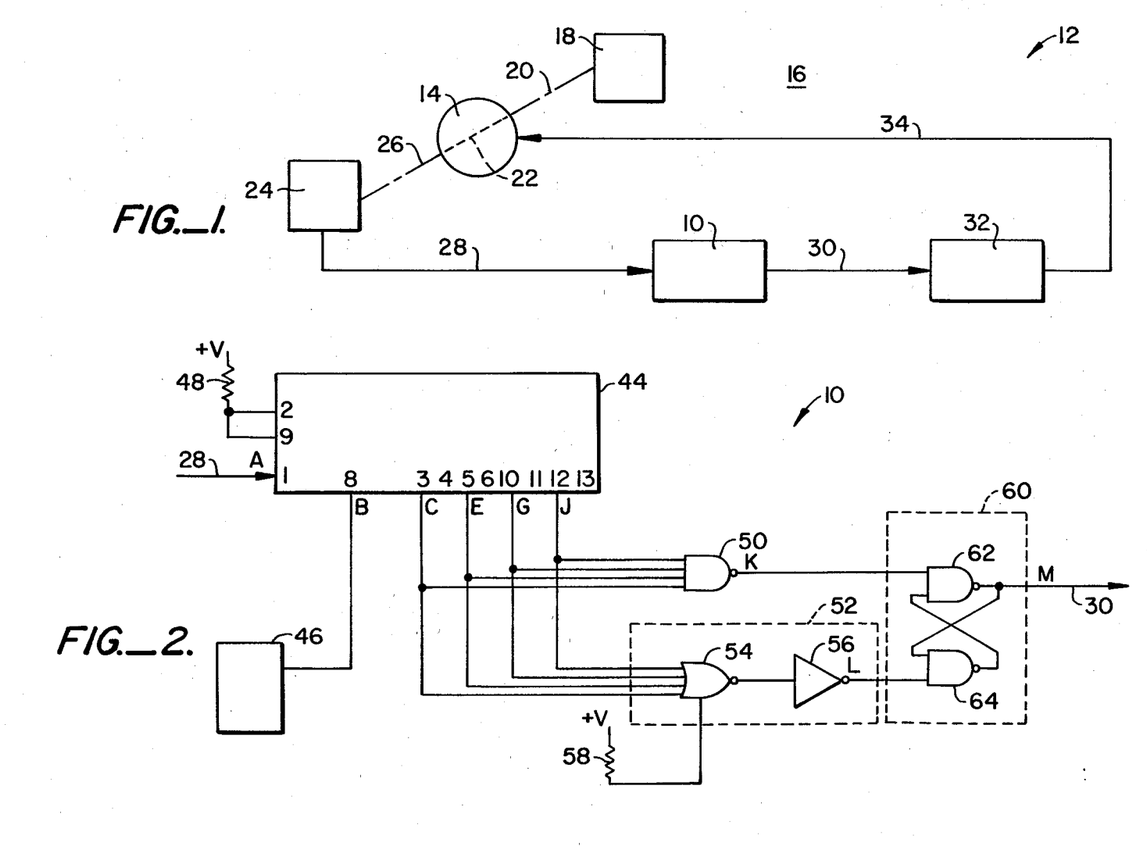
FIG. 1 is a block diagram of a servo control circuit which includes an embodiment in accordance with the invention for blanking noise present in an alternating electrical signal.
FIG. 2 is a schematic circuit diagram for an implementation of the embodiment shown in FIG. 1 for blanking noise present in an alternating electrical signal.

In accordance with the invention, a method and apparatus are provided for blanking noise present in an alternating electrical signal. By way of example, an embodiment of the noise blanking circuit in accordance with the invention, generally indicated by the numeral 10 in FIG. 1, is incorporated into a servo control circuit 12 for a servomotor 14 included in an automated positioning system 16. The servomotor 14 in turn, again by way of example, moves a positionable element 18 in the form of a printing means, such as a print wheel or carriage of a daisy wheel printer, via a mechanical link 20 connected to the drive shaft 22 of the servomotor.

Movement of the positionable element 18 can be detected by any known technique including the use of a shaft encoder or, alternatively, a tachometer. Preferably, as shown in FIG. 1, a shaft encoder 24 included in the servo control circuit 12 is connected via a mechanical link 26 to the drive shaft 22 of the servomotor 14. The shaft encoder 24 encodes the angular position of the drive shaft 22, which is correlated to the actual position of the positionable element 18. Movement of the positionable element 18 is evidenced by an alternating electrical control output signal produced by the shaft encoder 24.

The circuit of the shaft encoder 24 preferably includes wave shaping circuitry for filtering the alternating electrical control output signal produced by the shaft encoder and for converting the shaft encoder output signal to a squarewave form, that is, a pulse train comprising pulses having either a first logic state (low state) or a second logic state (high state). The filter can comprise a resistor-capacitor filter having a time constant which is dependent upon the particular use to which the servo control circuit 12 shown in FIG. 1 is applied. In the case where the positionable element 18 is a printing means, for example, the time constant for the filter can be on the order of 40 microseconds, for example.

The output of the shaft encoder 24 is connected by a lead 28 to the input of the noise blanking circuit 10. The output of the noise blanking circuit 10 is connected by a lead 30 to a servomotor drive circuit 32 which produces a drive signal fed to the servomotor 14 over leads 34.

Figure 3:
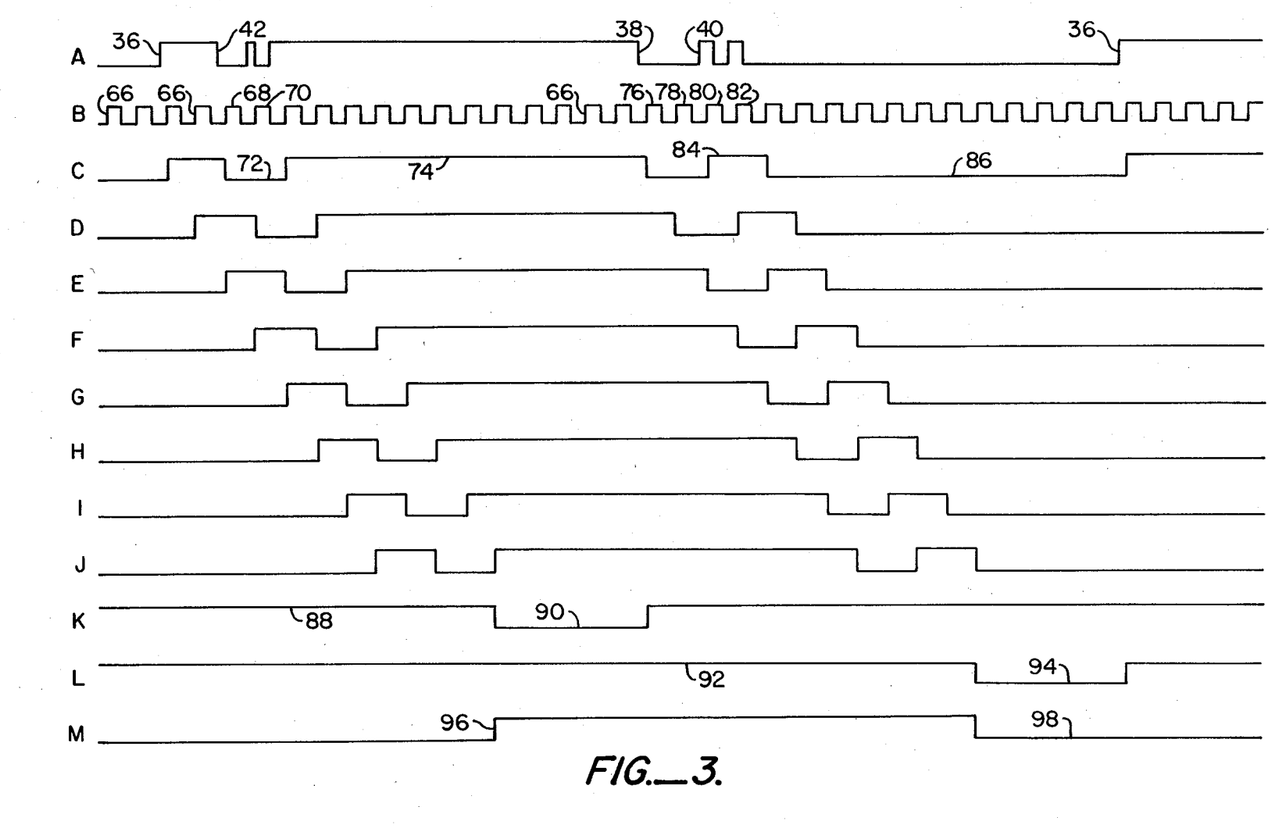
FIG. 3 illustrates electrical signals which appear at various nodes of the circuit shown in FIG. 2.

As mentioned earlier, spurious noise can appear in the alternating electrical control output signal from the shaft encoder 24. The output signal from the shaft encoder 24 is typically or can be converted to a squarewave pulse train. The pulse train from the shaft encoder 24, which appears on the lead 28, can have the form shown in FIG. 3A, for example. As shown in FIG. 3A, the pulse train is characterized by being an alternating electrical signal comprised of squarewave pulses having leading edges 36 as represented by amplitude changes of a first given character, for example, positive-going, or rising, amplitude changes. Furthermore, the squarewave pulses have trailing edges 38 as represented by amplitude changes of a second given character, that is, negative-going, or falling, amplitude changes.

As shown in FIG. 3A, noise can be present in the pulse train from the shaft encoder 24 shown in FIG. 1, specifically, noise having an amplitude change of the first given character, that is, a positive-going amplitude change, as indicated at 40 in FIG. 3A. The noise 40 is represented as being similar to a squarewave pulse having a leading edge 36 included in the pulse train from the shaft encoder 24 shown in FIG. 1. Also, noise can be present as indicated at 42 in FIG. 3A having an amplitude change of the second given character, that is, a negative-going amplitude change, which is represented as being similar to a squarewave pulse having a trailing edge 38 included in the pulse train from the shaft encoder 24 shown in FIG. 1. The noise blanking circuit 10 is responsive to the incoming alternating electrical control signal in the form of the pulse train from the shaft encoder 24 for blanking the noise 40 and noise 42 shown in FIG. 3A in order to provide an outgoing alternating electrical control signal as shown in FIG. 3M in which there is no evidence of the noise.

Referring again to FIG. 1, the noise blanking circuit 10 is responsive to an incoming alternating electrical control signal on the lead 28 from the shaft encoder 24, such as the signal shown in FIG. 3A, for detecting noise present in the signal and producing an outgoing alternating electrical control signal on the lead 30 shown in FIG. 1, in which evidence of the noise 40 and noise 42 shown in FIG. 3A does not appear. An implementation of the noise blanking circuit 10 is shown in FIG. 2.

The noise-laden alternating electrical control signal shown in FIG. 3A from the shaft encoder 24 shown in FIG. 1 appears on the lead 28 shown in FIG. 2, which is also designated as node A corresponding to the circuit location where the signal shown in FIG. 3A appears. As shown in FIG. 2, the lead 28 is connected to a first or serial input (pin 1) of a shift register means 44 (preferably an eight-bit serial-to-parallel shift register type 74164 integrated circuit) included in the noise blanking circuit 10. Clock signals having a preselected frequency are applied to a second or clock input (pin 8) of the shift register means 44. Preferably, the clock signals are produced by a clock oscillator circuit 46 whose output is connected to the clock input of the shift register means 44.

The clock signals produced by the clock oscillator circuit 46 preferably form a pulse train comprised of squarewave pulses having a preselected frequency, for example, 187.5 kilohertz (KHz), as shown in FIG. 3B. The clock signals produced by the clock oscillator circuit 46 shown in FIG. 2 preferably have a fifty percent duty cycle, which in the case of a preselected frequency of 187.5 KHz translates to squarewave pulses having the logic state (low state) for a period of approximately 2.67 microseconds alternating with the second logic state (high state) for the same period, namely, approximately 2.67 microseconds. Digital samples of the incoming alternating electrical control signal shown in FIG. 3A are stored in respective registers or storage locations included in the shift register means 44 shown in FIG. 2 and are shifted in response to the positive-going leading edges of the clock signals.

The serial input of the shift register means 44 comprises one input of a two-input AND gate. The other input (pin 2) of the two-input AND gate included in the shift register means 44 is connected through a pull-up resistor 48 to a second logic state (high state) voltage source, for example, a regulated +5-volt direct current (DC) power supply. Consequently, the actual logic states which appear at the serial input of the shift register means 44 are sequentially shifted into the first storage location of the shift register means at the times of occurrence of the positive-going leading edges of the clock signals produced by the clock oscillator circuit 46; that is, a first logic state (low state) is shifted into the first storage location of the shift register means upon the occurrence of a positive-going leading edge of one of the clock signals, if the incoming alternating electrical control signal which appears on the lead 28 is at the first logic state (low state) at the time the positive-going leading edge of the clock signal appears, and, conversely, a second logic state (high state) is shifted into the first storage location of the shift register means, if the control signal is at the second logic state (high state) at the time the positive-going leading edge of the clock signal occurs.

A clear input (pin 9) of the shift register means 44 is also connected to the regulated high state DC power supply through the pull-up resistor 48. Consequently, the clear input of the shift register means 44 is disenabled.

The shift register means 44 includes eight parallel outputs (pins 3, 4, 5, 6, 10, 11, 12, and 13) connected to the respective storage locations included in the shift register means. Preferably, as shown in FIG. 2, the parallel output (pin 3), connected to the first storage location of the shift register means 44, is connected to a first input of a NAND gate 50 included in the noise blanking circuit 10. Similarly, the third parallel output (pin 5), connected to the third storage location of the shift register means 44, is connected to a second input of the NAND gate 50. Also, the fifth parallel output (pin 10), connected to the fifth storage location of the shift register means 44, is connected to a third input of the NAND gate 50. Finally, the eighth parallel output (pin 13), connected to the eighth storage location of the shift register means 44, is connected to a fourth input of the NAND gate 50. The NAND gate 50 can be a type SN7420 integrated circuit which has only four inputs. An identical result can be achieved, however, if an eight-input NAND gate were available and all eight parallel outputs of the shift register means 44 were connected to respective inputs of the eight-input NAND gate.

The output signal produced by the NAND gate 50 assumes the second logic state (high state) when the first logic state (low state) appears at one or more of the first, third, fifth, or eighth parallel outputs of the shift register means 44. Conversely, the output signal produced by the NAND gate 50 assumes the first logic state (low state) only when the second logic state (high state) appears at all of the first, third, fifth, and eighth parallel outputs of the shift register means 44.

As shown in FIG. 2, the first parallel output, connected to the first storage location of the shift register means 44, is also connected to a first input of an inverting NOR circuit 52 included in the noise blanking circuit 10. Similarly, the third parallel output, connected to the third storage location of the shift register means 44, is connected to a second input of the inverting NOR circuit 52. Also, the fifth parallel output, connected to the fifth storage location of the shift register means 44, is connected to a third input of the inverting NOR circuit 52. Finally, the eighth parallel output, connected to the eighth storage location of the shift register means 44, is connected to a fourth input of the inverting NOR circuit 52.

The inverting NOR circuit 52 preferably comprises a NOR gate 54, which can be a type SN7425 integrated circuit, connected in series with an inverter 56. For the sake of completeness, in the case where the NOR gate 54 is implemented by means of a type SN7425 integrated circuit, a strobe input of the NOR gate is connected through a pull-up resistor 58 to the regulated high state DC power supply. The type SN7425 integrated circuit has only four inputs. An identical result can be achieved, however, if an eight-input NOR gate were available and all eight parallel outputs of the shift register means 44 were connected to respective inputs of the eight-input NOR gate.

The output signal produced by the NOR gate 54 assumes the first logic state (low state) when the second logic state (high state) appears at one or more of the first, third, fifth, or eighth parallel outputs of the shift register means 44. Conversely, the output signal produced by the NOR gate 54 assumes the second logic state (high state) only when the first logic state (low state) appears at all of the first, third, fifth, and eighth parallel outputs of the shift register means 44.

The output signal produced by the NOR gate 54 is inverted by the inverter 56. Consequently, the output signal produced by the inverting NOR circuit 52 assumes the second logic state (high state) when the second logic state (high state) appears at one or more of the first, third, fifth, and eighth parallel outputs of the shift register means 44, and, conversely, the output signal produced by the inverting NOR circuit assumes the first logic state (low state) only when the first logic state (low state) appears at all of the first, third, fifth, and eighth parallel outputs of the shift register means.

The output of the NAND gate 50 and the output of the inverting NOR circuit 52 are connected to the inputs of a latch circuit 60 included in the noise blanking circuit 10. The latch circuit 60 preferably comprises a pair of cross-coupled NAND gates 62 and 64. The output of the NAND gate 50 is connected to one input of the NAND gate 62, the other input of the NAND gate 62 being connected to the output of the NAND gate 64. The output of the inverting NOR circuit 52 is connected to one input of the NAND gate 64, the other input of the NAND gate 64 being connected to the output of the NAND gate 62. The output of the latch circuit 60 corresponds to the output of the NAND gate 62.

The output signal produced by the latch circuit 60, which corresponds to the output signal from the noise blanking circuit 10, assumes the first logic state (low state) when the output signal from the NAND gate 50 is at the second logic state (high state) and the output signal from the inverting NOR circuit 52 is at the first logic state (low state), which occurs only when the first logic state (low state) appears at all of the first, third, fifth, and eighth parallel outputs of the shift register means 44. Conversely, the output signal produced by the latch circuit 60, which corresponds to the output signal from the noise blanking circuit 10, assumes the second logic state (high state) only when the second logic state (high state) appears at all of the first, third, fifth, and eighth parallel outputs of the shift register means 44, which causes the output signal from the NAND gate 50 to assume the first logic state (low state) and the output signal from the inverting NOR circuit 52 to assume the second logic state (high state).

Lastly, the output of the latch circuit 60 is connected to the lead 30. As will be described shortly, the noise blanking circuit 10 operates so that noise having an amplitude change of the first given character, namely, positive-going noise, such as the noise 40 shown in FIG. 3A, and noise having an amplitude change of the second given character, namely, negative-going noise, such as the noise 42 shown in FIG. 3A, do not appear in the outgoing alternating electrical control signal on the lead 30 shown in FIG. 2.

The circuit shown in FIG. 2 is preferably implemented in TTL circuitry. However, different logic circuitry can be used.

The detailed operation of the noise blanking circuit 10 shown in FIG. 2 can be facilitated by reference jointly to FIGS. 2 and 3. The incoming alternating electrical control signal shown in FIG. 3A which appears o the lead 28 is input to the serial input of the shift register means 44.

The incoming alternating electrical control signal which appears at the serial input of the shift register means 44 is digitally sampled in response to the clock signals which appear at the clock input of the shift register means. The clock signals from the clock oscillator circuit 46 at node B shown in FIG. 2 are shown in FIG. 3B. In response to the positivegoing leading edge of each one of the clock signals shown in FIG. 3B, the logic state, either the first logic state (low state) or the second logic state (high state), of the incoming alternating electrical control signal which appears at the serial input of the shift register means 44 is shifted into the first storage location of the shift register means. The logic state of the incoming alternating electrical control signal initially shifted into the first storage location of the shift register means 44 is subsequently shifted from the first storage location to the second storage location of the shift register means in response to the next one of the clock signals and thence to the third storage location of the shift register means in response to the following clock signal, etc. Subsequently, after being shifted into the eighth storage location of the shift register means 44, in response to the next one of the clock signals, the logic state of the incoming alternating electrical control signal is shifted out of the shift register means. The output signals which appear at the first, third, fifth, and eighth parallel outputs of the shift register means 44 at nodes C, E, G, and J, respectively, shown in FIG. 2 are shown in FIGS. 3C, 3E, 3G, and 3J, respectively.

The digital samples of the incoming alternating electrical control signal which appear at the first, third, fifth, and eighth parallel outputs of the shift register means 44 are input to the NAND gate 50. The output signal produced by the NAND gate 50 at node K shown in FIG. 2 is shown in FIG. 3K. The NAND gate 50 produces an output signal having the first logic state (low state) only when all of the digital samples of the incoming alternating electrical control signal which appear at the first, third, fifth, and eighth parallel outputs of the shift register means 44 are at the second logic state (high state). Conversely, if one or more of the digital samples of the incoming alternating electrical control signal stored in the first, third, fifth, and eighth storage locations of the shift register means 44 is at the first logic state (low state), the output signal produced by the NAND gate 50 assumes the second logic state (high state).

The digital samples of the incoming alternating electrical control signal which appear at the first, third, fifth, and eighth parallel outputs of the shift register means 44 are also input to the inverting NOR circuit 52. The output signal produced by the inverting NOR circuit 52 at node L shown in FIG. 2 is shown in FIG. 3L. The inverting NOR circuit 52 produces an output signal having the first logic state (low state) only when all of the digital samples of the incoming alternating electrical control signal which appear at the first, third, fifth, and eighth parallel outputs of the shift register means 44 are at the first logic state (low state). Conversely, if one or more of the digital samples of the incoming alternating electrical control signal stored in the first, third, fifth, and eighth storage locations of the shift register means 44 is at the second logic state (high state), the output signal produced by the inverting NOR circuit 52 assumes the second logic state (high state).

The output signals from the NAND gate 50 and the inverting NOR circuit 52 are input to the latch circuit 60. The output signal produced by the latch circuit 60 at node M shown in FIG. 2, which corresponds to the output signal from the noise blanking circuit 10, is shown in FIG. 3M. The latch circuit 60 produces an output signal which transposes to the second logic state (high state) when all of the digital samples of the incoming alternating electrical control signal stored in the first, third, fifth, and eighth storage locations of the shift register means 44 are at the second logic state (high state). Conversely, the output signal produced by the latch circuit 60 transposes to the first logic state (low state) when all of the digital samples of the incoming alternating electrical control signal stored in the first, third, fifth, and eighth storage locations of the shift register means 44 are at the first logic state (low state).

Digital sampling of the incoming alternating electrical control signal shown in FIG. 3A which appears at the serial input of the shift register means 44 in response to the clock signals shown in FIG. 3B produces the output signals shown in FIGS. 3C through 3J at the parallel outputs of the shift register means. Although only the output signals shown in FIGS. 3C, 3E, 3G, and 3J which appear at the first, third, fifth, and eighth parallel outputs of the shift register means 44 affect the operation of the noise blanking circuit 10 shown in FIG. 2, the output signals which appear at all eight parallel outputs of the shift register means are shown in FIG. 3 for the sake of completeness.

As shown in FIGS. 3A through 3C, the logic states of the incoming alternating electrical control signal shown in FIG. 3A at the times of occurrence of the positive-going leading edges 66 of the clock signals shown in FIG. 3B are sequentially shifted into the first storage location of the shift register means 44 as represented by the output signal from the first storage location of the shift register means shown in FIG. 3C. Considered in further detail, the logic state of the incoming alternating electrical control signal shown in FIG. 3A is at the first logic state (low state) at the times of occurrence of the positive-going leading edges of the initial two clock signals shown in FIG. 3B. Upon the occurrence of the positive-going leading edge of the third one of the clock signals shown in FIG. 3B, however, the logic state of the incoming alternating electrical control signal shown in FIG. 3A is at the second logic state (high state). Consequently, the digital sample shifted into the first storage location of the shift register means 44 is at the second logic state (high state).

The incoming alternating electrical control signal shown in FIG. 3A remains at the second logic state (high state) until the occurrence of the noise 42 shown in FIG. 3A. As a consequence of the noise 42, digital sampling of the incoming alternating electrical control signal shown in FIG. 3A at the times of occurrence of the positive-going leading edges of clock signals 68 and 70 shown in FIG. 3B causes the digital samples sequentially shifted into the first storage location of the shift register means 44 to be at the first logic state (low state) as shown at 72 in FIG. 3C. Subsequently, upon the dissipation of the noise 42 and the consequent return of the incoming alternating electrical control signal shown in FIG. 3A to the second logic state (high state), the digital samples sequentially shifted into the first storage location of the shift register means 44 are again at the second logic state (high state) as shown at 74 in FIG. 3C.

The logic state of the incoming alternating electrical control signal shown in FIG. 3A is at the first logic state (low state) at the times of occurrence of the positive-going leading edges of clock signals 76 and 78 shown in FIG. 3B. Consequently, the digital samples of the incoming alternating electrical control signal sequentially shifted into the first storage location of the shift register means 44 are at the first logic state (low state).

The incoming alternating electrical control signal shown in FIG. 3A remains at the first logic state (low state) until the occurrence of the noise 40 shown in FIG. 3A. As a consequence of the noise 40, digital sampling of the incoming alternating electrical control signal shown in FIG. 3A at the times of occurrence of the positive-going leading edges of clock signals 80 and 82 shown in FIG. 3B causes the digital samples sequentially shifted into the first storage location of the shift register means 44 to be at the second logic state (high state) as shown at 84 in FIG. 3C. Subsequently, upon the dissipation of the noise 40 and the consequent return of the incoming alternating electrical control signal shown in FIG. 3A to the first logic state (low state), the digital samples sequentially shifted into the first storage location of the shift register means 44 are again at the first logic state (low state) as shown at 86 in FIG. 3C.

FIGS. 3C through 3J show that the digital samples of the incoming alternating electrical control signal at the times of occurrence of the positive-going leading edges of the clock signals shown in FIG. 3B are sequentially shifted from one storage location to the next and finally out of the shift register means 44. The difference between the output signals which appear at the parallel outputs of the shift register means 44 shown in FIGS. 3C through 3J are the phases of the respective signals. The output signals which appear at all of the storage locations of the shift register means 44, which is preferably an eight-bit shift register, are shown in FIGS. 3C through 3J in order to better illustrate the phase differences.

The output signals shown in FIGS. 3C, 3E, 3G, and 3J which appear at the first, third, fifth, and eighth parallel outputs of the shift register means 44 are input to the NAND gate 50 which produces the output signal shown in FIG. 3K. In response to the signals shown in FIGS. 3C, 3E, 3G, and 3J stored in the first, third, fifth, and eighth storage locations of the shift register means 44, the NAND gate 50 produces an output signal having the second logic state (high state) when one or more of the output signals from the first, third, fifth, and eighth storage locations of the shift register means is at the first logic state (low state) as shown at 88 in FIG. 3K. When all of the signals shown in FIGS. 3C, 3E, 3G, and 3J which appear at the first, third, fifth, and eighth parallel outputs of the shift register means 44 are at the second logic state (high state), however, the output signal produced by the NAND gate 50 transposes to the first logic state (low state) as shown at 90 in FIG. 3K. As a consequence of the operation of the shift register means 44 in response to the noise 42 and the logical combination of the output signals from the shift register means by means of the NAND gate 50, there is no evidence of the noise 42 in the output signal produced by the latch circuit 60, as indicated by a comparison of the noise-laden incoming alternating electrical control signal shown in FIG. 3A with the output signal produced by the latch circuit, which corresponds to the output signal from the noise blanking circuit 10, shown in FIG. 3M.

The signals shown in FIGS. 3C, 3E, 3G, and 3J which appear at the first, third, fifth, and eighth parallel outputs of the shift register means 44 are also input to the inverting NOR circuit 52 which produces the output signal shown in FIG. 3L. In response to the signals shown in FIGS. 3C, 3E, 3G, and 3J stored in the first, third, fifth, and eighth storage locations of the shift register means 44, the inverting NOR circuit 52 produces an output signal having the second logic state (high state) when one or more of the output signals from the first, third, fifth, and eighth storage locations of the shift register means is at the second logic state (high state) as shown at 92 in FIG. 3L. When all of the signals shown in FIGS. 3C, 3E, 3G, and 3J which appear at the first, third, fifth, and eighth parallel outputs of the shift register means 44 are at the first logic state (low state), however, the output signal produced by the inverting NOR circuit 52 transposes to the first logic state (low state) as shown at 94 in FIG. 3L. Evidence of the noise 40 is not present in the output signal from the latch circuit 60 as a consequence of the operation of the shift register means 44 in response to the noise 40 and the logical combination of the output signals from the shift register means by means of the inverting NOR circuit 52, as indicated by a comparison of the noise-laden incoming alternating electrical control signal shown in FIG. 3A with the output signal produced by the latch circuit, which corresponds to the output signal from the noise blanking circuit 10, shown in FIG. 3M.

The output signal produced by the NAND gate 50 shown in FIG. 3K and the output signal produced by the inverting NOR circuit 52 shown in FIG. 3L are input to the latch circuit 60. The latch circuit 60 produces an output signal having the first logic state (low state) until such time as the digital samples of the incoming alternating electrical control signal which appear at the first, third, fifth, and eighth parallel outputs of the shift register means 44 all transpose to the second logic state (high state), whereupon the output signal produced by the NAND gate 50 transposes from the second logic state (high state) to the first logic state (low state), which causes the output signal produced by the latch circuit to transpose from the first logic state (low state) to the second logic state (high state) as shown at 96 in FIG. 3M. As shown in FIG. 3M, the output signal produced by the latch circuit 60 remains at the second logic state (high state) until such time as the digital samples of the incoming alternating electrical control signal stored in the first, third, fifth, and eighth storage locations of the shift register means 44 all transpose to the first logic state (low state), whereupon the output signal produced by the inverting NOR circuit 52 transposes from the second logic state (high state) to the first logic state (low state), which causes the output signal produced by the latch circuit to transpose from the second logic state (high state) to the first logic state (low state) as shown at 98 in FIG. 3M.

The output signal from the latch circuit 60 appears at node M shown in FIG. 2 and is shown in FIG. 3M and comprises the logical combination of the output signal from the NAND gate 50 and the output signal from the inverting NOR circuit 52 for blanking the noise 40 and noise 42 in the incoming alternating electrical control signal shown in FIG. 3A. The output signal from the latch circuit 60 provides an outgoing alternating electrical control signal in which evidence of the noise 40 and noise 42 is eliminated at the node M shown in FIG. 2, which corresponds to the lead 30.

In summary, when what appears to be a transposition to the second logic state (high state), indicated by what appears to be a leading edge 36 of the incoming alternating electrical control signal, is detected, a digital sampling means in the form of the shift register means 44 stores samples at preselected internals, for example, at intervals of 5.33 microseconds. If the transposition to the second logic state (high state) does not persist for at least a predetermined period, for example, a 40-microsecond period, the positive-going electrical signal is considered to be noise. If the second logic state (high state) persists for at least the predetermined period, the positive-going electrical signal is considered to be a valid pulse. This condition continues until what appears to be a transposition to the first logic state (low state) indicated by a trailing edge 38 of the incoming alternating electrical control signal is sensed.

Similar to the case of detection of a valid positive-going electrical signal, when what appears to be a transposition to the first logic state (low state), indicated by what appears to be a trailing edge 38 of the incoming alternating electrical control signal, is detected, the digital sampling means in the form of the shift register means 44 stores samples, preferably at intervals of 5.33 microseconds. If the transposition to the first logic state (low state) does not persist for at least the predetermined period, the negative-going electrical signal is considered to be noise. If the first logic state (low state) persists for at least the predetermined period, the negative-going electrical signal is considered to be a valid pulse.

Preferably, the preselected period of the clock signals is 5.33 microseconds. The period of the clock signals can, however, be other than 5.33 microseconds. In the case where the noise blanking circuit 10 is incorporated into the servo control circuit 12 shown in FIG. 1, the period of the clock signals is preferably keyed to the slew rate for the servomotor 14. The slew rate for the servomotor 14, for example, can be 250 microseconds. The choice of 5.33 microseconds is based on the selection of 40 microseconds, which is approximately one-sixth of the slew period, as the maximum expected noise duration (i.e., electrical signals which do not persist for at least 40 microseconds are rejected as noise). The selection of 40 microseconds assures that valid pulses in the incoming alternating electrical control signal are not missed. The selection of 5.33 microseconds as the period of the clock signals is then based on the implementation of the shift register means 44 included in the embodiment shown in FIG. 2 by means of an eight-bit shift register, such that the selected clock signal period (5.33 microseconds) times the number of storage locations included in the shift register (eight) approximately equals the maximum expected noise duration (approximately 40 microseconds). Therefore, the selectivity of the noise blanking circuit 10, that is, the noise rejection characteristic of the noise blanking circuit, can be selected by adjusting the clock signal period and/or number of storage locations included in the shift register means 44. Also, for a given shift register means 44, changing the connections of the parallel outputs, connected to the storage locations of the shift register means, to the inputs of the NAND gate 50 and inverting NOR circuit 52 can produce an identical result to adjusting the number of storage locations included in the shift register means for selecting the noise rejection characteristic of the noise blanking circuit 10.

Although one implementation of the noise blanking circuit 10 is shown in FIG. 2, the apparatus for blanking noise present in an alternating electrical control signal in accordance with the invention can be implemented by other means, namely, a microprocessor circuit having a set of programmed instructions stored in a read only memory included in the microprocessor. A microprocessor circuit can be programmed for digitally sampling the incoming alternating electrical control signal as performed by the shift register means 44 and logically combining the digital samples as performed by the NAND gate 50, inverting NOR circuit 52, and latch circuit 60 for producing an outgoing alternating electrical control signal in which evidence of the noise 40 and noise 42 shown in FIG. 3A is eliminated. The circuit shown in FIG. 2 is, however, preferred since a microprocessor circuit can be more complex and costly.

In actual tests conducted, the noise blanking circuit in accordance with the invention has enabled error free operation of extremely noisy servomechanisms in daisy wheel printers. Consequently, the method and apparatus in accordance with the invention solve the problem of noise in the shaft encoder or tachometer signals causing erroneous interpretation of the operation of the print wheel and carriage. As a result, the quality of printing is improved and damage to or breakage of the print wheel is avoided.

While various embodiments of a noise blanking circuit have been described in order to make the invention understandable to those skilled in the art, it will be appreciated that modifications not mentioned will become apparent to those skilled in the art. It is to be clearly understood that the above description is by way of example and illustration only and is not to be taken by way of limitation. Accordingly, the spirit and scope of this invention are ascertainable only by reference to the appended claims.

What is claimed is:

1. A method for blanking noise present in an alternating electrical signal correlated to movement of a positionable element in an automated positioning system, comprising the steps of:

inputting the alternating electrical signal to a first input of a shift register means having a plurality of outputs;

inputting clock signals having a preselected frequency to a second input of the shift register means for digitally sampling the alternating electrical signal at the times of occurrence of the clock signals so as to produce digital samples shiftably stored in respective storage locations of the shift register means connected to the plurality of outputs of the shift register means;

inputting the digital samples appearing at predetermined ones of the plurality of outputs of the shift register means to a logic circuit means for producing a first logic state as an output signal, when a first logic state appears at the predetermined ones of the plurality of outputs of the shift register means, and a second logic state as the output signal, when a second logic state appears at the predetermined ones of the plurality of outputs of the shift register means; and outputting the output signal produced by the logic circuit means as an outgoing alternating electrical control signal correlated to movement of the positionable element;

whereby the noise does not appear in the outgoing alternating electrical control signal.

2. The method of claim 1 wherein the frequency of the clock signals is preselected for determining a selected noise rejection characteristic.

3. The method of claim 1 wherein the number of storage locations of the shift register means is preselected for determining a selected noise rejection characteristic.

4. The method of claim 1 wherein the frequency of the clock signals and the number of storage locations of the shift register means are preselected for determining a selected noise rejection characteristic.

5. The method of claim 1 wherein the predetermined ones of the plurality of outputs of the shift register means connected to the logic circuit means are preselected for determining a selected noise rejection characteristic.

6. A method for blanking noise present in an alternating electrical signal, comprising the steps of:
  inputting the alternating electrical signal to a serial input of a shift register means having a plurality of parallel outputs;
  inputting clock signals having a preselected frequency to a clock input of the shift register means for digitally sampling the alternating electrical signal at the preselected frequency, the logic states of the alternating electrical signal at the times of occurrence of the clock signals being shiftably stored in respective storage locations of the shift register means connected to the plurality of parallel outputs of the shift register means;
  inputting the logic states appearing at predetermined ones of the plurality of parallel outputs of the shift register means to a first logic circuit means for producing a first logic state as an output signal from the first logic circuit means when a second logic state appears at the predetermined ones of the plurality of parallel outputs of the shift register means, the second logic state being produced as the output signal from the first logic circuit means when the first logic state appears at any of the predetermined ones of the plurality of parallel outputs of the shift register means;
  inputting the logic states appearing at the predetermined ones of the plurality of parallel outputs of the shift register means to a second logic circuit means for producing the first logic state as an output signal from the second logic circuit means when the first logic state appears at the predetermined ones of the plurality of parallel outputs of the shift register means, the second logic state being produced as the output signal from the second logic circuit means when the second logic state appears at any of the predetermined ones of the plurality of parallel outputs of the shift register means; and
  inputting the output signals from the first and second logic circuit means to a latch circuit means for producing the first logic state as an output signal from the latch circuit means, when the output signal from the second logic circuit means transposes to the first logic state, and the second logic state as the output signal from the latch circuit means, when the output signal from the first logic circuit means transposes to the first logic state.

7. The method of claim 6 wherein the frequency of the clock signals is preselected for determining a selected noise rejection characteristic.

8. The method of claim 6 wherein the number of storage locations of the shift register means is preselected for determining a selected noise rejection characteristic.

9. The method of claim 6 wherein the frequency of the clock signals and the number of storage locations of the shift register means are preselected for determining a selected noise rejection characteristic.

10. The method of claim 6 wherein the predetermined ones of the plurality of parallel oututs of the shift register means connected to the first and second logic circuit means are preselected for determining a selected noise rejection characteristic.

11. A method for blanking noise present in an alternating electrical signal, comprising the steps of:
  generating clock signals at a preselected frequency;
  inputting the alternating electrical signal to a serial input of a serial-to-parallel shift register having a plurality of parallel outputs;
  inputting the clock signals to a clock input of the shift register for digitally sampling the alternating electrical signal at the preselected frequency, the logic states of the alternating electrical signal at the times of occurrence of the clock signals being shiftably stored in respective storage locations of the shift register, the respective storage locations of the shift register being connected to the plurality of parallel outputs of the shift register;
  inputting the logic states appearing at predetermined ones of the plurality of parallel outputs of the shift register to a NAND gate circuit for producing a low logic state as an output signal from the NAND gate circuit when a high logic state appears at the predetermined ones of the plurality of parallel outputs of the shift register, the high logic state being produced as the output signal from the NAND gate circuit when the low logic state appears at any of the predetermined ones of the plurality of parallel outputs of the shift register;
  inputting the logic states appearing at the predetermined ones of the plurality of parallel outputs of the shift register to an inverting NOR circuit for producing the low logic state as an output signal from the inverting NOR circuit when the low logic state appears at the predetermined ones of the plurality of parallel outputs of the shift register, the high logic state being produced as the output signal from the inverting NOR circuit when the high logic state appears at any of the predetermined ones of the plurality of parallel outputs of the shift register; and
  inputting the output signals from the NAND gate circuit and inverting NOR circuit to a latch circuit for producing the low logic state as an output signal from the latch circuit, when the output signal from the inverting NOR circuit transposes to the low logic state, and the high logic state as the output signal from the latch circuit, when the output signal from the NAND gate circuit transposes to the low logic state.

12. The method of claim 11 wherein the frequency of the clock signals is preselected for determining a selected noise rejection characteristic.

13. The method of claim 11 wherein the number of storage locations of the shift register is preselected for determining a selected noise rejection characteristic.

14. The method of claim 11 wherein the frequency of the clock signals and the number of storage locations of the shift register are preselected for determining a selected noise rejection characteristic.

15. The method of claim 11 wherein the predetermined ones of the plurality of parallel outputs of the shift register connected to the NAND gate circuit and the inverting NOR circuit are preselected for determining a selected noise rejection characteristic.

16. Apparatus for blanking noise present in an alternating electrical signal correlated to movement of a positionable element in an automated positioning system, comprising:
   a shift register means having a first input, a second input, a plurality of outputs, and respective storage locations connected to the plurality of outputs;
   means for coupling the alternating electrical signal to the first input of the shift register means;
   means for coupling clock signals having a preselected frequency to the second input of the shift register means so as to digitally sample the alternating electrical signal at the times of occurrence of the clock signals in order to produce digital samples shiftably stored in the respective storage locations of the shift register means; and
   logic circuit means coupled to predetermined ones of the plurality of outputs of the shift register means for producing a first logic state as an output signal, when a first logic state appears at the predetermined ones of the plurality of outputs of the shift register means, and a second logic state as the output signal, when a second logic state appears at the predetermined ones of the plurality of outputs of the shift register means;
   the output signal produced by the logic circuit means being utilized as an outgoing alternating electrical control signal correlated to movement of the positionable element, in which there is no evidence of the noise.

17. The apparatus of claim 16, further comprising a shaft encoder means mechanically connected to the positionable element for producing the alternating electrical signal in response to movement of the positionable element.

18. The apparatus of claim 17, further comprising wave shaping circuitry included in the shaft encoder means for filtering the alternating electrical signal and for converting the alternating electrical signal to a squarewave form.

19. Apparatus for blanking noise present in an alternating electrical singal, comprising:
   a shift register means having a serial input, a clock input, a plurality of parallel outputs, and respective storage locations connected to the plurality of parallel outputs;
   means for coupling the alternating electrical signal to the serial input of the shift register;
   means for coupling clock signals having a preselected frequency to the clock input of the shift register means so as to digitally sample the alternating electrical signal at the preselected frequency, the logic states of the alternating electrical signal at the times of occurrence of the clock signals being shiftably stored in the respective storage locations of the shift register means connected to the plurality of parallel outputs of the shift register means;
   a first logic circuit means coupled to predetermined ones of the plurality of parallel outputs of the shift register means for producing a first logic state as an output signal from the first logic circuit means when a second logic state appears at the predetermined ones of the plurality of parallel outputs of the shift register means, the second logic state being produced as the output signal from the first logic circuit means when the first logic state appears at any of the predetermined ones of the plurality of parallel outputs of the shift register means;
   a second logic circuit means coupled to the predetermined ones of the plurality of parallel outputs of the shift register means for producing the first logic state as an output signal from the second logic circuit means when the first logic state appears at the predetermined ones of the plurality of parallel outputs of the shift register means, the second logic state being produced as the output signal from the second logic circuit means when the second logic state appears at any of the predetermined ones of the plurality of parallel outputs of the shift register means; and
   a latch circuit means coupled to the first and second logic circuit means for producing the first logic state as an output signal from the latch circuit means, when the output signal from the second logic circuit means transposes to the first logic state, and the second logic state as the output signal from the latch circuit means, when the output signal from the first logic circuit means transposes to the first logic state.

20. Apparatus for blanking noise present in an alternating electrical signal, comprising:
   means for generating clock signals at a preselected frequency;
   a serial-to-parallel shift register having a serial input, a clock input, a plurality of parallel outputs, and respective storage locations connected to the plurality of parallel outputs;
   means for coupling the alternating electrical signal to the serial input of the shift register;
   means for coupling the clock signals to the clock input of the shift register so as to digitally sample the alternating electrical signal at the preselected frequency, the logic states of the alternating electrical signal at the times of occurrence of the clock signals being shiftably stored in the respective storage locations of the shift register, the respective storage locations of the shift register being connected to the plurality of parallel outputs of the shift register;
   a NAND gate circuit coupled to predetermined ones of the plurality of parallel outputs of the shift register for producing a low logic state as an output signal from the NAND gate circuit when a high logic state appears at the predetermined ones of the plurality of parallel outputs of the shift register, the high logic state being produced as the output signal from the NAND gate circuit when the low logic state appears at any of the predetermined ones of the plurality of parallel outputs of the shift register;
   an inverting NOR circuit coupled to the predetermined ones of the plurality of parallel outputs of the shift register for producing the low logic state as an output signal from the inverting NOR circuit when the low logic state appears at the predetermined ones of the plurality of parallel outputs of the shift register, the high logic state being produced as the output signal from the inverting NOR circuit when the high logic state appears at any of the predetermined ones of the plurality of parallel outputs of the shift register; and a latch circuit coupled to the NAND gate circuit and inverting NOR circuit for producing the low logic state as an output signal from the latch circuit, when the output signal from the inverting NOR circuit transposes to the low logic state, and the high logic state as the output signal from the latch circuit, when the output signal from the NAND gate circuit transposes to the low logic state.

* * * * *